US012651102B2

(12) United States Patent
Dupre et al.

(10) Patent No.: US 12,651,102 B2
(45) Date of Patent: *Jun. 9, 2026

(54) SYSTEM AND METHOD FOR DESCRIBING A COMPONENT IN A COMPUTER-AIDED DESIGN (CAD) ENVIRONMENT

(71) Applicant: Pratt & Whitney Canada Corp., Longueuil (CA)

(72) Inventors: Francois Dupre, Laval (CA); Simon Gelinas, St-Constant (CA)

(73) Assignee: Pratt & Whitney Canada Corp., Longueuil (CA)

( * ) Notice: Subject to any disclaimer, the term of this patent is extended or adjusted under 35 U.S.C. 154(b) by 992 days.

This patent is subject to a terminal disclaimer.

(21) Appl. No.: 17/394,297

(22) Filed: Aug. 4, 2021

(65) Prior Publication Data

US 2023/0040150 A1      Feb. 9, 2023

(51) Int. Cl.
| | |
|---|---|
| *G06F 30/23* | (2020.01) |
| *G06F 30/12* | (2020.01) |
| *G06F 30/17* | (2020.01) |
| *G06T 17/10* | (2006.01) |

(52) U.S. Cl.
CPC ............. *G06F 30/23* (2020.01); *G06F 30/12* (2020.01); *G06F 30/17* (2020.01); *G06T 17/10* (2013.01)

(58) Field of Classification Search
CPC .......... G06F 30/23; G06F 30/12; G06F 30/17; G06F 2111/12; G06F 2111/20; G06F 2119/20; G06T 17/10
See application file for complete search history.

(56) References Cited

U.S. PATENT DOCUMENTS

| | | | | |
|---|---|---|---|---|
| 10,019,543 | B1 | 7/2018 | Kanthasamy | |
| 2002/0118229 | A1* | 8/2002 | Batori | G06T 19/00 |
| | | | | 715/771 |
| 2009/0033656 | A1* | 2/2009 | Larkins | G06T 17/00 |
| | | | | 345/419 |
| 2009/0185031 | A1* | 7/2009 | Miyake | H04N 9/3194 |
| | | | | 348/E5.022 |

(Continued)

OTHER PUBLICATIONS

Gopalakrishnan et al. Integrating materials model-based definitions into design, manufacturing, and sustainment: a digital twin demonstration of incorporating residual stresses in the lifecycle analysis of a turbine disk. Journal of Computing and Information Science in Engineering. Apr. 2021.12 Pages (Year: 2021).*

(Continued)

*Primary Examiner* — Eunhee Kim
(74) *Attorney, Agent, or Firm* — Getz Balich LLC

(57) ABSTRACT

A method for augmenting a three-dimensional model of a component in a computer-aided design (CAD) includes receiving a three-dimensional CAD model of the component. The three-dimensional CAD model includes a plurality of component surfaces. The method further includes generating a first three-dimensional surface representation of a first component surface of the plurality of component surfaces and indexing the first three-dimensional surface representation as a first function-attributed surface (FAS) element by assigning the first three-dimensional surface representation a unique first FAS ID which associates the first FAS element with the component.

15 Claims, 10 Drawing Sheets

(56) References Cited

U.S. PATENT DOCUMENTS

| | | | | |
|---|---|---|---|---|
| 2011/0111371 A1* | 5/2011 | Haber | .................... | A61C 1/084 |
| | | | | 433/201.1 |
| 2014/0160124 A1* | 6/2014 | Bavoil | ................. | G06T 15/506 |
| | | | | 345/420 |
| 2016/0125100 A1* | 5/2016 | Han | ........................ | G06F 30/00 |
| | | | | 703/1 |
| 2017/0135769 A1* | 5/2017 | Karlsson | ................ | A61B 6/032 |
| 2017/0148227 A1* | 5/2017 | Alsaffar | ................. | G06F 30/20 |
| 2018/0315237 A1* | 11/2018 | Byers | ..................... | G06T 19/00 |
| 2018/0322694 A1* | 11/2018 | Byers | ..................... | G06F 30/00 |
| 2020/0096967 A1* | 3/2020 | Sykes | ..................... | G06F 30/15 |
| 2020/0184119 A1* | 6/2020 | Machalica | ............. | G06F 30/17 |
| 2020/0387646 A1 | 12/2020 | Arancibia | | |

OTHER PUBLICATIONS

EP search report for EP22188323.4 dated Dec. 23, 2022.
Office Action for EP22188323.4 dated Jul. 18, 2024.

* cited by examiner

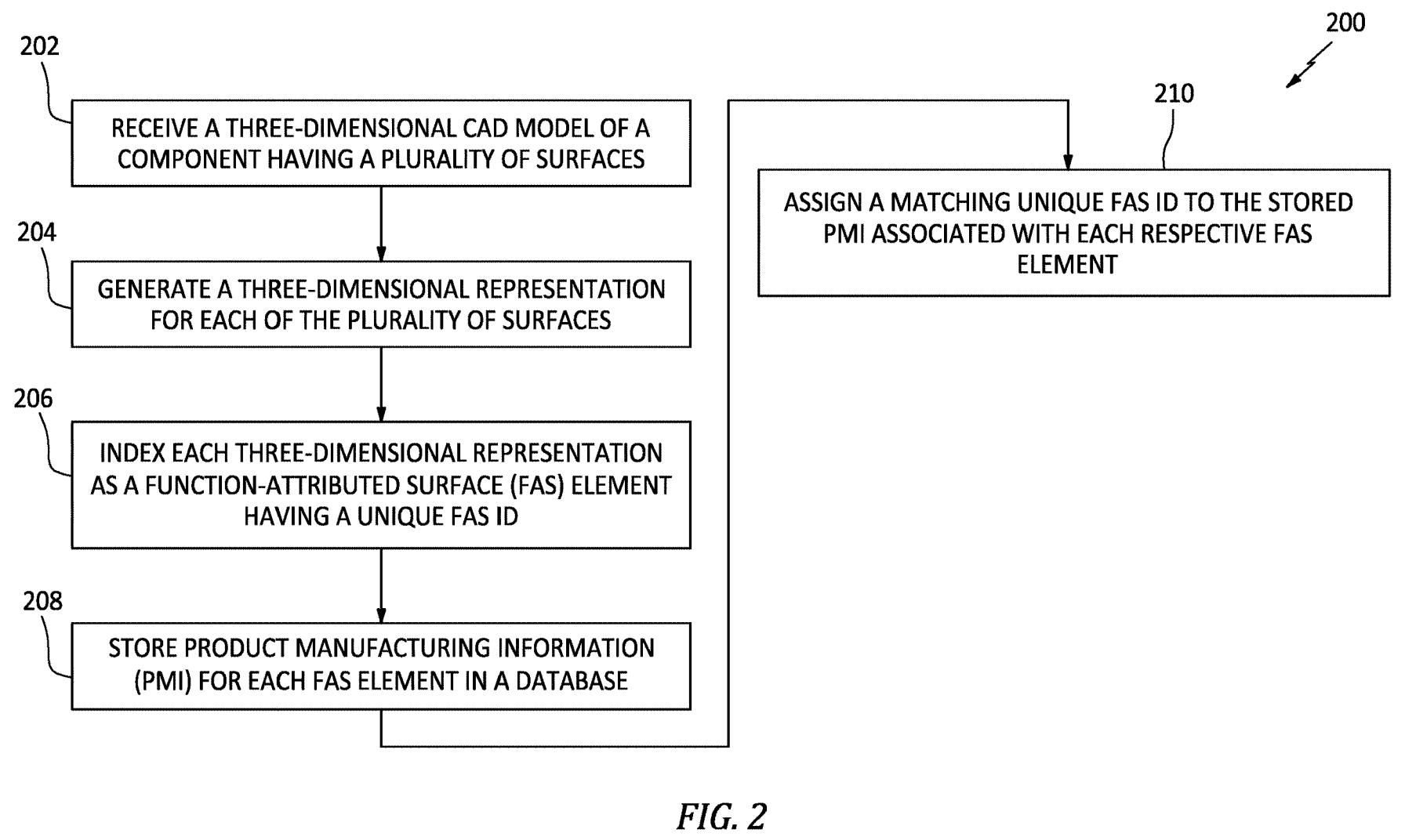

200

210

ASSIGN A MATCHING UNIQUE FAS ID TO THE STORED PMI ASSOCIATED WITH EACH RESPECTIVE FAS ELEMENT

202

RECEIVE A THREE-DIMENSIONAL CAD MODEL OF A COMPONENT HAVING A PLURALITY OF SURFACES

204

GENERATE A THREE-DIMENSIONAL REPRESENTATION FOR EACH OF THE PLURALITY OF SURFACES

206

INDEX EACH THREE-DIMENSIONAL REPRESENTATION AS A FUNCTION-ATTRIBUTED SURFACE (FAS) ELEMENT HAVING A UNIQUE FAS ID

208

STORE PRODUCT MANUFACTURING INFORMATION (PMI) FOR EACH FAS ELEMENT IN A DATABASE

*FIG. 2*

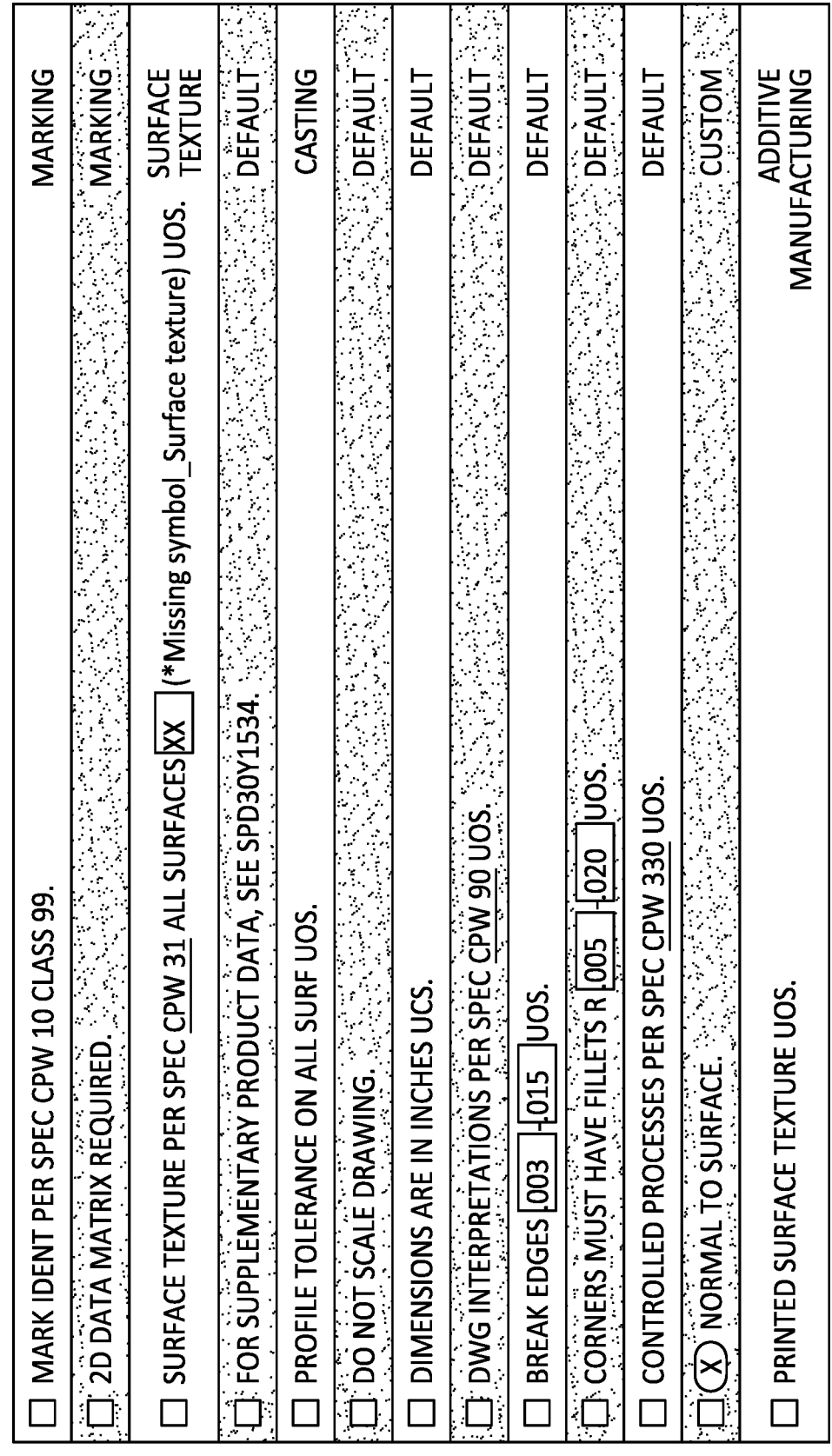

900

| | | |
|---|---|---|
| ☐ MARK IDENT PER SPEC CPW 10 CLASS 99. | | MARKING |
| ☐ 2D DATA MATRIX REQUIRED. | | MARKING |
| ☐ SURFACE TEXTURE PER SPEC CPW 31 ALL SURFACES [XX] (*Missing symbol_Surface texture) UOS. | | SURFACE TEXTURE |
| ☐ FOR SUPPLEMENTARY PRODUCT DATA, SEE SPD30Y1534. | | DEFAULT |
| ☐ PROFILE TOLERANCE ON ALL SURF UOS. | | CASTING |
| ☐ DO NOT SCALE DRAWING. | | DEFAULT |
| ☐ DIMENSIONS ARE IN INCHES UCS. | | DEFAULT |
| ☐ DWG INTERPRETATIONS PER SPEC CPW 90 UOS. | | DEFAULT |
| ☐ BREAK EDGES [003]-[015] UOS. | | DEFAULT |
| ☐ CORNERS MUST HAVE FILLETS R [005]-[020] UOS. | | DEFAULT |
| ☐ CONTROLLED PROCESSES PER SPEC CPW 330 UOS. | | DEFAULT |
| ☒Ⓧ NORMAL TO SURFACE. | | CUSTOM |
| ☐ PRINTED SURFACE TEXTURE UOS. | | ADDITIVE MANUFACTURING |

| FAS ID | Tolerance Type | Tol Min | Tol Max | Engineering Notes |
|--------|---------------|---------|---------|-------------------|
| FAS0001 | Thickness | 0.100 | 0.105 | |
| FAS0002 | Profile | -0.030 | 0.030 | |
| FAS0003 | Marking | | | MARK IDENT PER SEPC CPW XXX. |

*FIG. 10*

SYSTEM AND METHOD FOR DESCRIBING A COMPONENT IN A COMPUTER-AIDED DESIGN (CAD) ENVIRONMENT

BACKGROUND

1. Technical Field

This disclosure relates generally to computer-aided design (CAD), and more particularly to describing component manufacturing information in a CAD environment.

2. Background Information

Conventionally, engineers and designers have used computer-aided design (CAD) systems to develop two-dimensional engineering drawings for relaying component specifications and geometric dimensioning and tolerancing ("GD&T") information to manufacturers. However, the amount of information that can be conveyed using two-dimensional drawings (e.g., isometric and axonometric drawings) to represent three-dimensional components is limited. The geometrical definitions of some components (e.g., castings), such as those having organic shapes, may be too complex to be adequately described by two-dimensional drawings prepared using current industry standards. Further, the use of different industry standards, by various entities, for conveying component geometrical definitions may complicate component design and manufacturing. Further still, conventional two-dimensional drawings cannot be directly used by manufacturing equipment or software outside the CAD environment. Accordingly, there is a need for improved methods and systems for describing components in a CAD environment, which addresses one or more of the above-discussed concerns.

SUMMARY

It should be understood that any or all of the features or embodiments described herein can be used or combined in any combination with each and every other feature or embodiment described herein unless expressly noted otherwise.

According to an aspect of the present disclosure, a method for augmenting a three-dimensional model of a component in a computer-aided design (CAD) environment is provided. The method includes receiving a three-dimensional CAD model of the component. The three-dimensional CAD model includes a plurality of component surfaces. The method further includes generating a first three-dimensional surface representation of a first component surface of the plurality of component surfaces and indexing the first three-dimensional surface representation as a first function-attributed surface (FAS) element by assigning the first three-dimensional surface representation a unique first FAS ID which associates the first FAS element with the component.

In any of the aspects or embodiments described above and herein, the method may further include generating a second three-dimensional surface representation of a second component surface of the plurality of component surfaces, which is different than the first component surface, and indexing the second three-dimensional surface representation as a second FAS element by assigning the second three-dimensional surface representation a unique second FAS ID, different than the unique first FAS ID, which associates the second FAS element with the component.

In any of the aspects or embodiments described above and herein, the first FAS dataset may include at least one scalar attribute for the first component surface represented by the first FAS element.

In any of the aspects or embodiments described above and herein, the method may further include storing product manufacturing information (PMI) for the first FAS element in a first FAS dataset in a FAS database and assigning the unique first FAS ID to the first FAS dataset.

In any of the aspects or embodiments described above and herein, the method may further include generating a graphical user interface and receiving at least a portion of the PMI from a user via the graphical user interface.

In any of the aspects or embodiments described above and herein, the PMI may include contextual information.

In any of the aspects or embodiments described above and herein, the method may further include generating a geometrical representation of a non-surface geometrical element of the three-dimensional CAD model and indexing the geometrical representation as a second FAS element by assigning the geometrical representation a unique second FAS ID, different than the unique first FAS ID, which associates the second FAS element with the component.

In any of the aspects or embodiments described above and herein, the non-surface geometrical representation may be one of a point, a line, a plane, or a volume of the three-dimensional CAD model.

According to another aspect of the present disclosure, a system for augmenting a three-dimensional model of a component in a computer-aided design (CAD) environment includes a processor and memory in signal communication with the processor. The memory contains instructions recorded therein which, when executed by the processor, cause the processor to receive a three-dimensional CAD model of the component. The three-dimensional CAD model includes a plurality of component surfaces. The memory contains instructions recorded therein which, when executed by the processes, further cause the processor to generate a first three-dimensional surface representation of a first component surface of the plurality of component surfaces and index the first three-dimensional surface representation as a first function-attributed surface (FAS) element by assigning the first three-dimensional surface representation a unique first FAS ID which associates the first FAS element with the component.

In any of the aspects or embodiments described above and herein, the memory may contain instructions recorded therein which, when executed by the processor, further cause the processor to generate a second three-dimensional surface representation of a second component surface of the plurality of component surfaces, which is different than the first component surface, and index the second three-dimensional surface representation as a second FAS element by assigning the second three-dimensional surface representation a unique second FAS ID, different than the unique first FAS ID, which associates the second FAS element with the component.

In any of the aspects or embodiments described above and herein, the system may further include a FAS database in signal communication with the processor. The memory contains instructions recorded therein which, when executed by the processor, further cause the processor to store product manufacturing information (PMI) for the first FAS element as a first FAS dataset in the FAS database and assign the unique first FAS ID to the first FAS dataset.

In any of the aspects or embodiments described above and herein, the first FAS dataset may include at least one scalar attribute for the first component surface represented by the first FAS element.

In any of the aspects or embodiments described above and herein, the system may further include an input/output device in signal communication with the processor. The memory contains instructions recorded therein which, when executed by the processor, may further cause the processor to generate a graphical user interface for the input/output device and receive at least a portion of the PMI from a user via the graphical user interface on the input/output device.

In any of the aspects or embodiments described above and herein, the memory contains instructions recorded therein which, when executed by the processor, may further cause the processor to generate a geometrical representation of a non-surface geometrical element of the three-dimensional CAD model and index the geometrical representation as a second FAS element by assigning the geometrical representation a unique second FAS ID, different than the unique first FAS ID, which associates the second FAS element with the component.

In any of the aspects or embodiments described above and herein, the system may further include a communication network in signal communication with the processor.

According to another aspect of the present disclosure, a method for augmenting a three-dimensional model of a component in a computer-aided design (CAD) environment is provided. The method includes receiving a three-dimensional CAD model of the component. The three-dimensional CAD model includes a plurality of component surfaces. The method further includes generating a first surface representation of a first component surface of the plurality of component surfaces and generating a second surface representation of a second component surface of the plurality of component surfaces which is different than the first component surface. The method further includes indexing the first surface representation as a first function-attributed surface (FAS) element by assigning the first surface representation a unique first FAS ID which associates the first FAS element with the component and indexing the second surface representation as a second FAS element by assigning the second surface representation a unique second FAS ID, different than the unique first FAS ID, which associates the second FAS element with the component.

In any of the aspects or embodiments described above and herein, the method may further include storing product manufacturing information (PMI) for the first FAS element as a first FAS dataset in a FAS database and assigning the unique first FAS ID to the first FAS dataset.

In any of the aspects or embodiments described above and herein, the PMI may include at least one scalar attribute for the first component surface represented by the first FAS element.

In any of the aspects or embodiments described above and herein, the PMI may include contextual information.

In any of the aspects or embodiments described above and herein, the PMI may be stored in the first FAS dataset as an object-oriented structure string.

The present disclosure, and all its aspects, embodiments and advantages associated therewith will become more readily apparent in view of the detailed description provided below, including the accompanying drawings.

BRIEF DESCRIPTION OF THE DRAWINGS

FIG. 2 illustrates a flowchart depicting a method for augmenting a three-dimensional model of a component in a computer-aided design (CAD) environment, in accordance with one or more embodiments of the present disclosure.

FIG. 9 illustrates an exemplary graphical user interface (GUI) for receiving PMI from a user, in accordance with one or more embodiments of the present disclosure.

FIG. 10 illustrates an exemplary PMI dataset associated with a particular FAS element, in accordance with one or more embodiments of the present disclosure.

DETAILED DESCRIPTION

The present disclosure includes systems and methods for augmenting a three-dimensional model of a component in a computer-aided design (CAD) environment. In particular, the systems and methods of the present disclosure provide a substantial improvement to conventional two-dimensional engineering drawings (e.g., isometric and axonometric drawings) used in component design and manufacturing and provide a three-dimensional definition of components which may be completely encoded using digital parameters and native CAD functionality.

Figure 1:
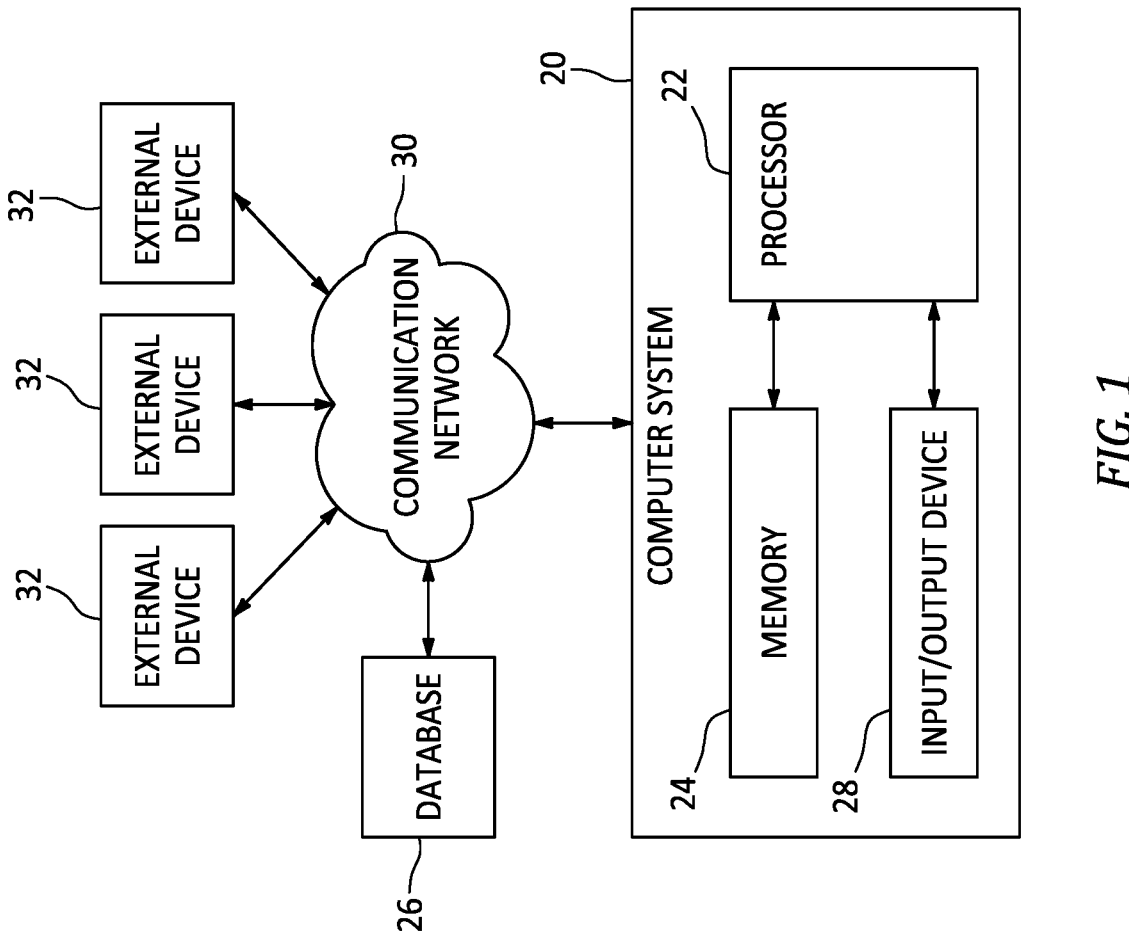
FIG. 1 illustrates a schematic block diagram of an exemplary computer system, in accordance with one or more embodiments of the present disclosure.

Referring to FIG. 1, a diagram of an exemplary computer system 20 is shown. The computer system 20 may be configured to implement one or more aspects of the present disclosure, however, the present disclosure is not limited to this particular computer system embodiment. The computer system 20 includes a processor 22 in signal communication with memory 24. The processor 22 may be any type of computing device, computational circuit, or processing circuit capable of executing a series of instructions that are stored in memory 24. The processor 22 may include multiple processors and/or multicore CPUs and may include any type of processor, such as a microprocessor, digital signal processor, co-processors, a micro-controller, a microcomputer, a central processing unit, a field programmable gate array, a programmable logic device, a state machine, logic circuitry, analog circuitry, digital circuitry, etc., and any combination thereof. The instructions stored in memory 24 may represent one or more algorithms for controlling the aspects of the computer system 20, and the stored instructions are not limited to any particular form (e.g., program files, system data, buffers, drivers, utilities, system programs, etc.) provided they can be executed by the processor 22. The memory 24 may be a non-transitory computer readable storage medium configured to store instructions that when executed by the processor 22, cause the processor 22 to perform or cause the performance of certain functions. The memory 24 may be a single memory device or a plurality of memory devices. A memory device may include a storage area network, network attached storage, as well as a disk drive, a read-only memory, random access memory, volatile memory, non-volatile memory, static memory, dynamic memory, flash memory, cache memory, and/or any device that stores digital information. One skilled in the art will appreciate, based on a review of this disclosure, that the implementation of the computer system 20 may be achieved by the use of hardware, software, firmware, or any combination thereof.

In various embodiments, the computer system 20 may include a database 26 in signal communication with the processor 22. In various embodiments, the database 26 may be located external to the computer system 20 and in signal communication with the computer system 20 via any wired or wireless protocol. In various other embodiments, the database 26 may be integral to the computer system 20. For example, the database 26 may be integrated with the memory 24. In various embodiments, the computer system 20 may also include input (e.g., a keyboard, a touch screen, etc.) and output devices (e.g., a monitor, sensor readouts, data ports, etc.) (hereinafter input/output device 28), in signal communication with the processor 22, that enable a user to input instructions, receive data, etc.

The computer system 20 may be connected to a communication network 30. The communication network 30 may include any suitable electronic communication network or combination of electronic communication networks including, but not limited to, wired and/or wireless local area networks, internet-based networks, cloud-based storage and communication networks, and the like. The communication network 30 may allow remote electronic communications between the computer system 20 and one or more devices such as the database 26 and/or one or more external devices 32 including, for example, computer workstations, manufacturer-based computers such as computer-aided manufacturing (CAM) computers, manufacturing equipment such as additive manufacturing equipment, component casting equipment, and component scanning equipment, etc.

Figures 3, 4:
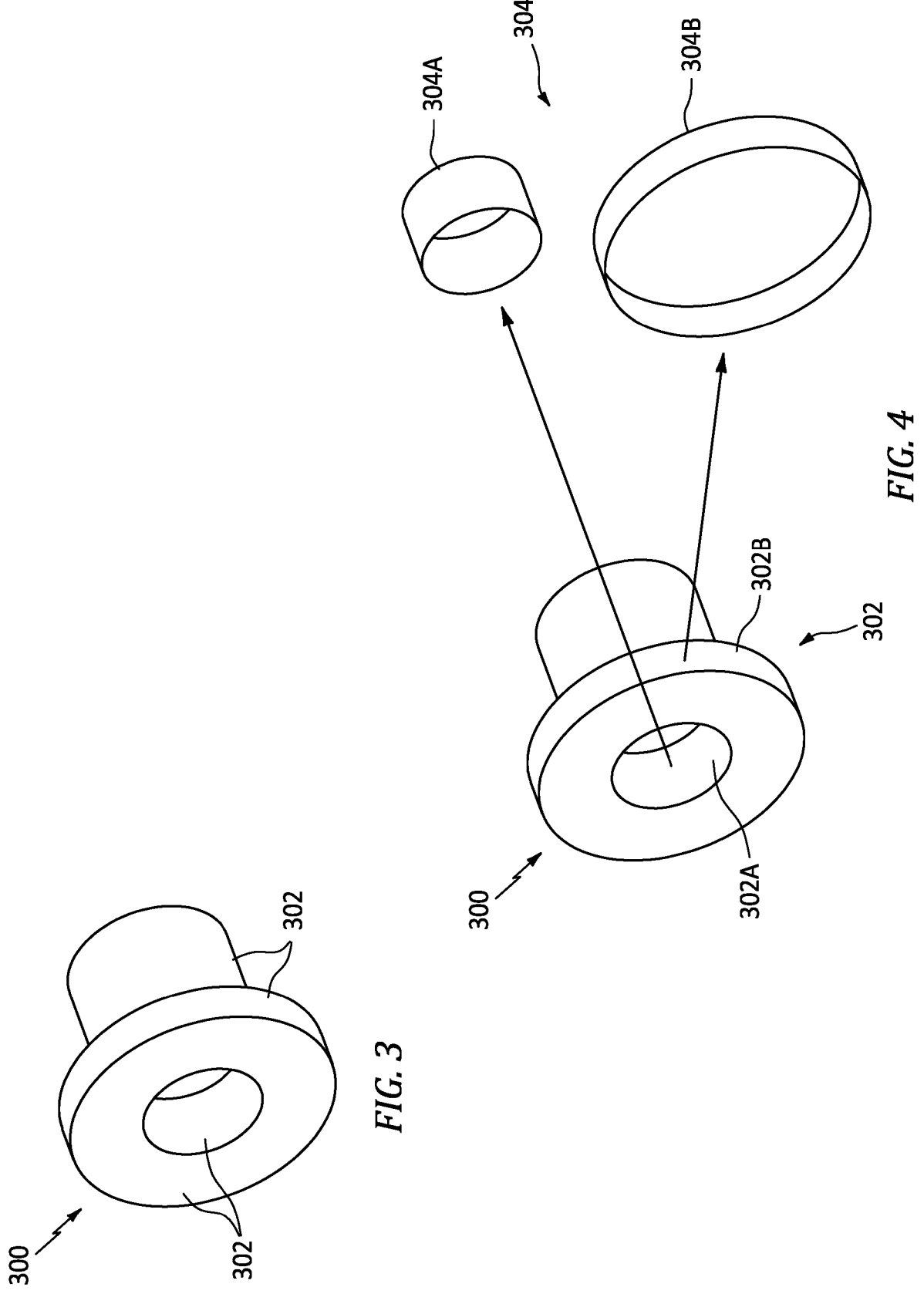
FIG. 3 illustrates a perspective view of a three-dimensional CAD model of an exemplary component, in accordance with one or more embodiments of the present disclosure.
FIG. 4 illustrates perspective views of CAD-based surface representations extracted from surfaces of the CAD model of FIG. 3, in accordance with one or more embodiments of the present disclosure.

Referring to FIGS. 1-3, the present disclosure includes a method 200 for describing a component in a computer-aided design (CAD) environment. For ease of description, the method 200 is described below with reference to the computer system 20 of FIG. 1. The method 200, however, may alternatively be performed with other computer system configurations. Unless otherwise noted herein, it should be understood that the steps of method 200 are not required to be performed in the specific sequence in which they are discussed below and, in various embodiments, the steps of method 200 may be performed separately or simultaneously.

Step 202 of the method 200 includes receiving a three-dimensional CAD model 300 (e.g., a boundary definition model) of a component with the computer system 20 using a suitable CAD system, platform, or software (which may also be referred to herein as a "CAD environment"). The present disclosure is not limited to any particular CAD system, platform, or software. The CAD model 300 includes a plurality of component surfaces 302 which may be exterior and/or interior surfaces of the CAD model 300 for a modeled component. The CAD model 300 may additionally include points, lines, axes, planes, surfaces, volumes, etc. of the modeled component. Accordingly, the CAD model 300 may include geometric features of the component which may be used for manufacturing and/or assembly of the modeled component. The CAD model 300 may be stored in memory 24, the database 26, or one or more external device 32 for use by the computer system 20. The CAD model 300 may be stored as a single file or as multiple files which are readable by compatible CAD software. In various embodiments, step 202 may include generating the CAD model 300, for example, within the CAD environment.

Referring to FIGS. 2-4, step 204 of the method 200 includes extracting surface information from the CAD model 300 and generating a CAD-based surface representation 304 of each of the surfaces of the plurality of component surfaces 302 of the CAD model 300. The CAD-based surface representation 304 may be a three-dimensional surface representation as shown, for example, in FIG. 4, which illustrates a first surface representation 304A of a cylindrical surface extracted from a bore hole of the CAD model 300. In one example of the present disclosure method 200, as illustrated in FIG. 4, step 202 may include generating the first surface representation 304A of a first component surface 302A of the plurality of component surfaces 302. Step 202 may further include generating a second surface representation 304B of a second component surface 302B of the plurality of component surfaces 302 which is different than the first component surface 302A. The surface representation 304 may be generated in the CAD environment and may be a unique CAD model which is independent of the CAD model 300 of the component. Each surface representation 304 may be stored in the CAD environment, independent of the CAD model 300.

Referring to FIGS. 2-7, step 206 of the method 200 includes indexing each surface representation 304 as a function-attributed surface (FAS) element 500 by assigning each surface representation 304 a unique FAS ID 502 which associates each respective FAS element 500 with the component represented by the CAD model 300. Accordingly, in combination with the step 204, each surface of the plurality of component surfaces 302 of the CAD model 300 may be extracted to generate a respective plurality of CAD-based surface representations 304, which may each be assigned respective unique FAS IDs 502, thereby designating the surface representations 304 as FAS elements 500 associated with the component represented by the CAD model 300. In one example of the present disclosure method 200, as illustrated in FIG. 4, step 206 may include indexing the first surface representation 304A of a first component surface 302A of the plurality of component surfaces 302 by assigning the first surface representation 304A a unique first FAS ID 502. For further example, Step 206 may additionally include indexing a second surface representation 304B of a second component surface 302B of the plurality of component surfaces 302 by assigning the second surface representation 304B a unique second FAS ID 502, which is different than the first FAS ID 502. As will be described in further detail, the FAS elements 500 may be used to describe the characteristics of the modeled component so as to obviate the need for conventional two-dimensional engineering drawings (e.g., GD&T drawings) in component design and manufacturing processes. For clarity, the term "FAS element" is described herein with respect to surface representations of three-dimensional CAD models, however, it should be understood that the FAS element 500 may represent any kind of geometrical element such as, but not limited to, points, lines, axes, planes, surfaces, volumes, etc. of the CAD model 300.

Figure 6:
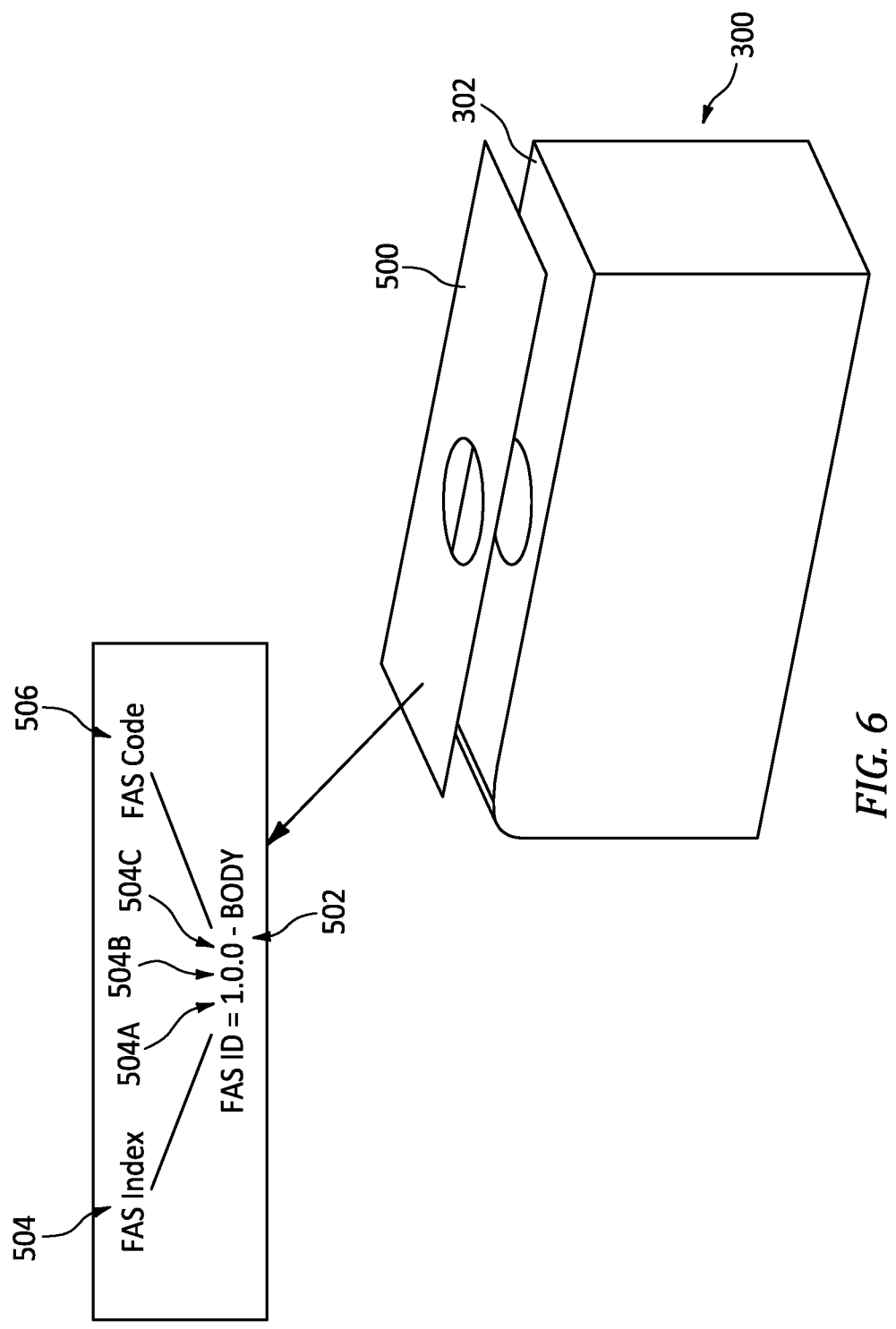
FIG. 6 illustrates a perspective view of a FAS element corresponding to a surface representation extracted from a surface of an exemplary CAD model, in accordance with one or more embodiments of the present disclosure.
Figures 7A, 7B:
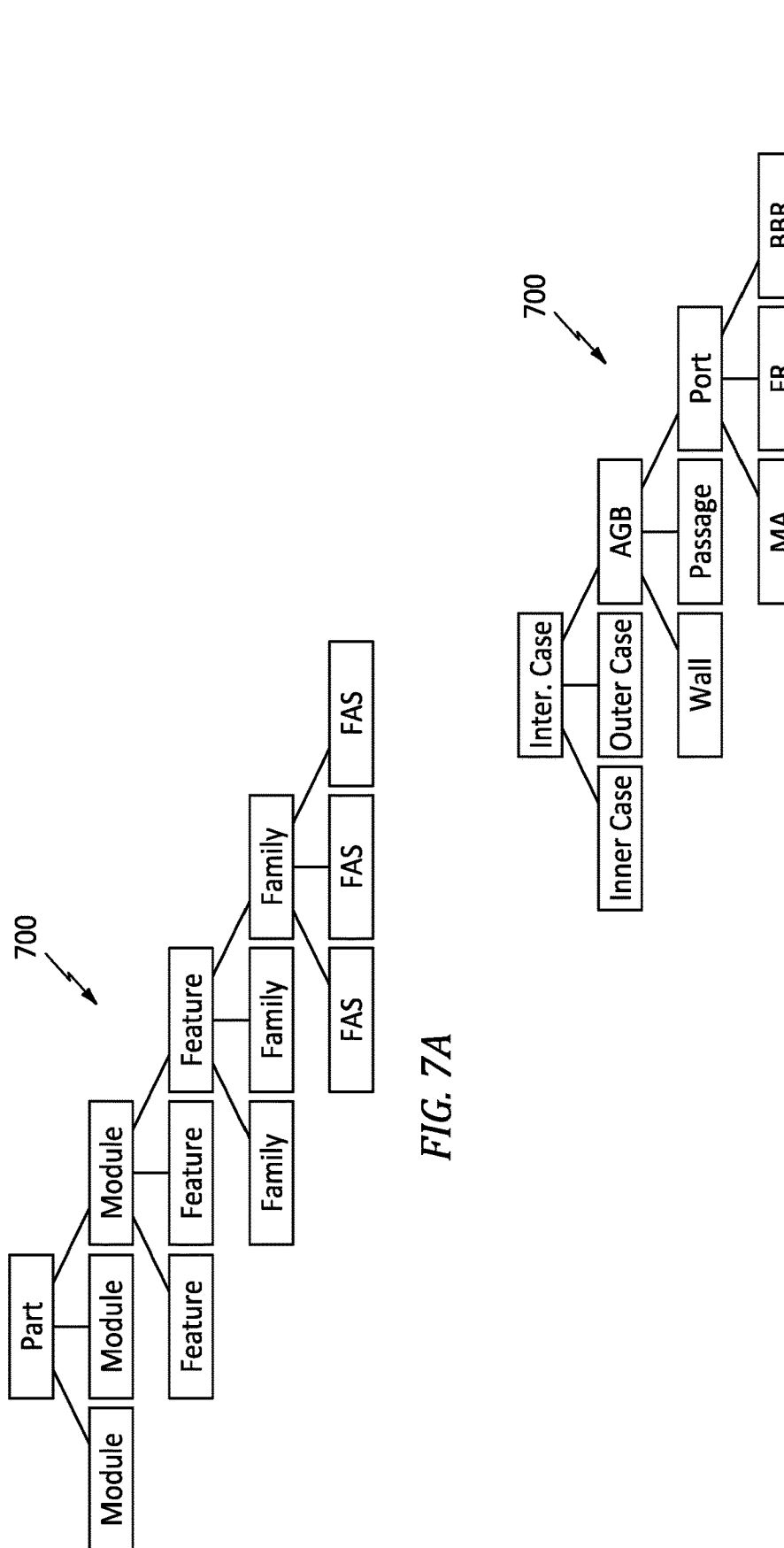
FIG. 7A-B illustrate exemplary FAS system hierarchy trees, in accordance with one or more embodiments of the present disclosure.
Figure 8:
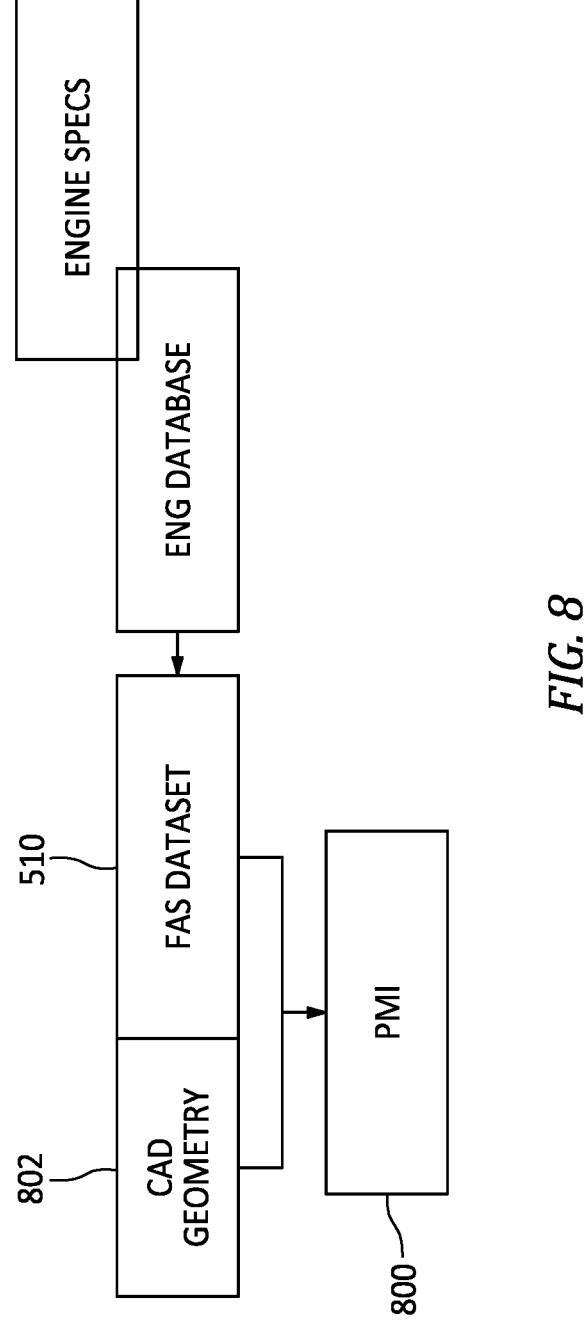
FIG. 8 illustrates a block diagram of a product manufacturing information (PMI) data structure, in accordance with one or more embodiments of the present disclosure.

As shown, for example, in FIG. 6, the FAS ID 502 may include both FAS index number 504 and FAS code 506 elements which may be determined based on a predetermined FAS nomenclature 508. The FAS index number 504 may be used to identify a logical relationship between elements of a component feature, a component, a module, or a broader system or part including multiple components. For example, with reference to the exemplary FAS IDs 502 of FIG. 6 and the exemplary FAS hierarchy trees 700 shown in FIGS. 7A and 7B, a first digit 504A of the FAS index number 504 may refer to one or more structural features or portions of a particular module. A second digit 504B of the FAS index number 504 may refer to one or more families of a feature. A third digit 504C of the FAS index number 504 may refer to one or more surfaces of a family. Alternatively, in various embodiments, the FAS ID 502 may be represented by a number or string of characters (e.g., a Unicode 13 string of characters) and the present disclosure is not limited to a particular configuration of the FAS ID 502. FIG. 6 illustrates an exemplary component having a FAS element 500 which is representative of a component surface of the exemplary component.

Referring to FIGS. 2-11, step 208 of the method 200 includes storing information associated with each FAS element 500. The stored information associated with each FAS element 500 may be stored as one or more scalar attributes of a respective component surface 302 (see, e.g., FIG. 10). The stored information for a FAS element 500 may include product manufacturing information (PMI) 800 including one or more scalar attributes. As shown in the block diagram of FIG. 8, at least a portion of the PMI 800 for each FAS element 500 may be stored as a FAS dataset 510. For example, PMI 800 for a first FAS element 500 may be stored in a first FAS dataset 510, PMI 800 for a second FAS element 500 may be stored in a second FAS dataset 510, etc. The PMI 800 for each FAS element 500 may include the GD&T information, associated with the respective component surface of the plurality of component surfaces 302 represented by each FAS element 500, used for manufacturing an associated component. The GD&T information may include, for example, at least one dimensional tolerance requirement for the component surface represented by the respective FAS element 500. The FAS dataset 510 for each FAS element 500 may further include PMI 800 such as information and specifications associated with the respective component and/or equipment in which the respective component is used (e.g., a gas turbine engine). The FAS dataset 510 for each FAS element 500 may further include PMI 800 including additional contextual information associated with each FAS element 500 such as, but not limited to, stress peak area, airflow direction with respect to the component surface represented by the FAS element 500, stack-up information (e.g., bearing stack-up information), design notes, etc. The FAS dataset 510 for each FAS element 500 may further include PMI 800 such as life cycle information for the associated component or equipment, repair information, and/or information gathered during component and/or equipment operation which may be used for future part design. As shown in the block diagram of FIG. 8, at least another portion of the PMI 800 may be CAD geometry 802 (e.g., component surface geometry) for the FAS element 500 which is maintained in the CAD environment.

In various embodiments, step 208 may further include generating a graphical user interface (GUI) 900 as shown, for example, in FIG. 9. The GUI 900 may be used to prompt a user to enter additional PMI 800 for a particular FAS element 500 which may be stored in the respective FAS dataset 510. Accordingly, step 208 may include receiving additional PMI 800 from a user via the GUI 900.

As discussed above, the FAS dataset 510 may be stored in the database 26 independent of the CAD environment and may be linked to the FAS element 500 (e.g., linked to the CAD software file including the FAS element 500), as will be discussed in further detail. In various other embodiments, both the FAS element 500 and the FAS dataset 510 may be maintained within the CAD environment (e.g., within a particular CAD software file). In still other various embodiments, a single software file may include the combined and reformatted FAS element 500 data extracted from the CAD environment as well as the FAS dataset 510 (e.g., using a STEP AP242 standard). The present disclosure is not limited to any particular system or method for storage of the FAS element 500 CAD geometry 802 data or the PMI 800 contained within the FAS dataset 510.

Figure 11:
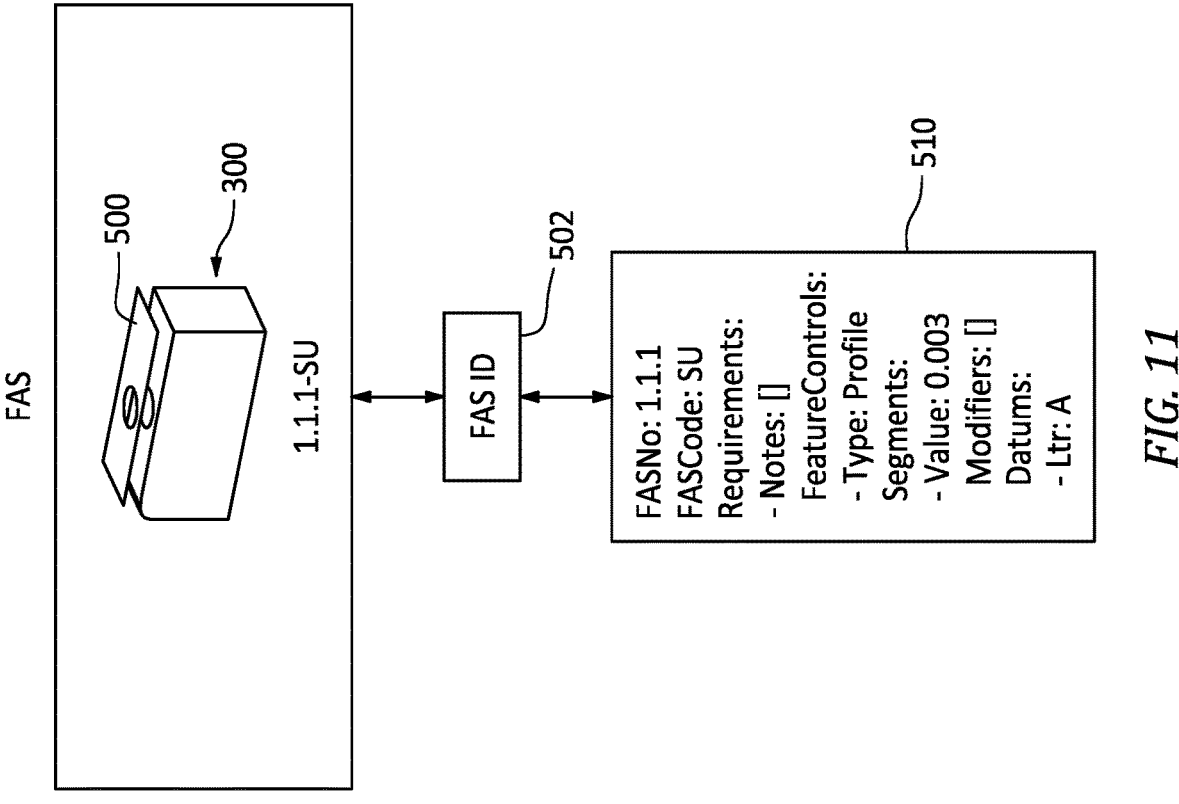
FIG. 11 illustrates a FAS element linked with an associated FAS dataset, in accordance with one or more embodiments of the present disclosure.

FIGS. 10 and 11 illustrate exemplary FAS datasets 510. As shown in FIG. 10, in various embodiments, the FAS dataset 510 may include PMI 800 defined by one or more scalar attributes. The PMI 800 included in the FAS dataset 510 may be formatted as a machine-readable language. For more complex components, the PMI 800 may be included in one or more machine-readable language strings. For example, the PMI 800 for the FAS dataset 510 may be included in a YAML format, as shown in FIG. 11. However, the present disclosure is not limited to the use of a YAML format for the FAS dataset 510 and other machine-readable languages may be considered such as, but not limited, to XML, HTML, SGML, etc. As also shown in FIG. 11, the PMI 800 may be defined using an object-oriented structure string including scalar and/or non-scalar variables and attributes. Accordingly, the present disclosure system and method allows any component information to be configured as customized digital information which can be reused by computer software, for example, manufacturing software, outside of the CAD environment. Accordingly, the present disclosure system and method is not limited to attributes or properties provided by default in the CAD environment.

Figure 5:
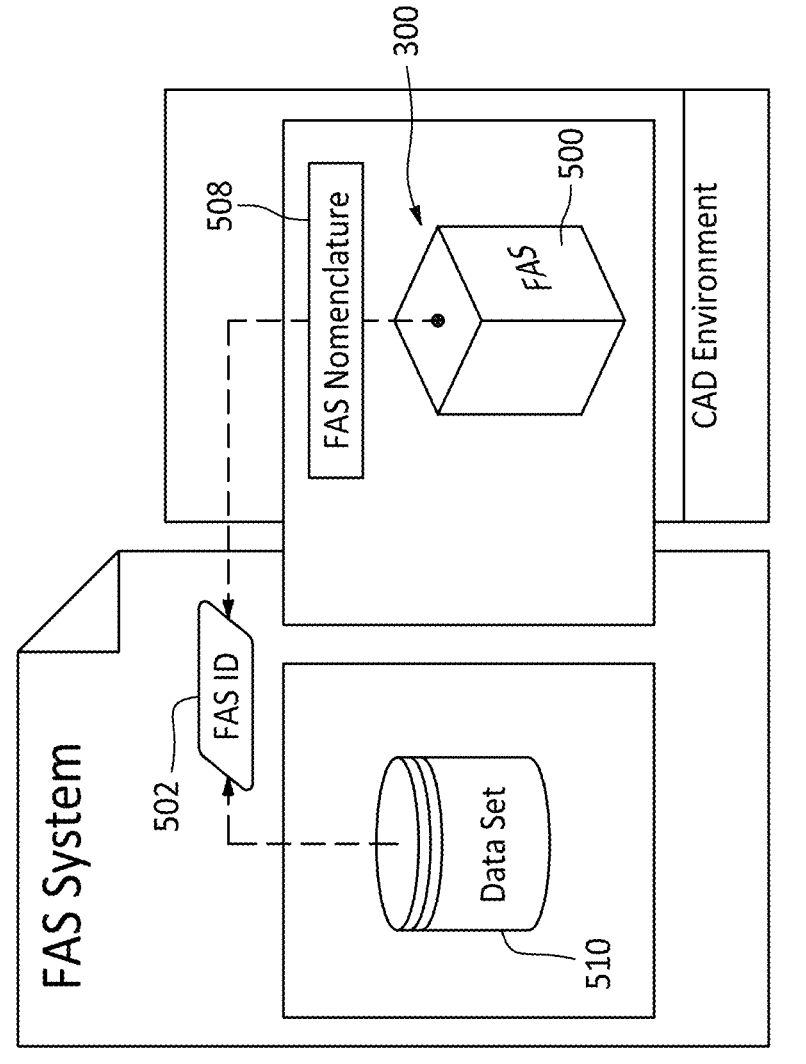
FIG. 5 illustrates a block diagram of a function-attributed surface (FAS) system, in accordance with one or more embodiments of the present disclosure.

Referring to FIGS. 2, 5, and 11, step 210 of method 200 includes indexing each FAS dataset 510 by assigning each particular FAS dataset 510 the unique FAS ID 502 corresponding to the FAS element 500 for which the particular FAS dataset 510 describes. In other words, each FAS element 500 and associated FAS dataset 510 are assigned a matching FAS ID 502, thereby linking each FAS element 500 with an associated FAS dataset 510 as shown, for example, in FIGS. 5 and 11.

It is noted that various connections are set forth between elements in the preceding description and in the drawings. It is noted that these connections are general and, unless specified otherwise, may be direct or indirect and that this specification is not intended to be limiting in this respect. A coupling between two or more entities may refer to a direct connection or an indirect connection. An indirect connection may incorporate one or more intervening entities. It is further noted that various method or process steps for embodiments of the present disclosure are described in the following description and drawings. The description may present the method and/or process steps as a particular sequence. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the description should not be construed as a limitation.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f) unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

While various aspects of the present disclosure have been disclosed, it will be apparent to those of ordinary skill in the art that many more embodiments and implementations are possible within the scope of the present disclosure. For example, the present disclosure as described herein includes several aspects and embodiments that include particular features. Although these particular features may be described individually, it is within the scope of the present disclosure that some or all of these features may be combined with any one of the aspects and remain within the scope of the present disclosure. References to "various embodiments," "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Accordingly, the present disclosure is not to be restricted except in light of the attached claims and their equivalents.

What is claimed is:

1. A computer implemented method for augmenting a three-dimensional model of a gas turbine engine component in a computer-aided design (CAD) environment, the method comprising:

receiving a three-dimensional CAD model of the component, the three-dimensional CAD model including a plurality of component surfaces;

generating a first three-dimensional surface representation of a first component surface of the plurality of component surfaces;

indexing, on a computer, the first three-dimensional surface representation as a first function-attributed surface (FAS) element by assigning the first three-dimensional surface representation a unique first FAS ID which associates the first FAS element with the component;

storing, on one or more memory devices, a product manufacturing information (PMI) for the first FAS element as a first FAS dataset in a FAS database, wherein the PMI includes contextual information including one of stress peak area, airflow direction of the first component surface, stack-up information, life cycle information, repair information, or information gathered during component operation;

assigning the unique first FAS ID to the first FAS dataset;

generating a graphical user interface displayed on a touch screen;

receiving at least a portion of the PMI from a user via the graphical user interface displayed on the touch screen; and manufacturing the modeled gas turbine engine component, with a manufacturing equipment, based on the three-dimensional CAD model;

wherein the unique first FAS ID is based on a hierarchical tree referring to one or more features of the three-dimensional CAD model; and wherein the generating the first three-dimensional surface representation and indexing the first three-dimensional surface representation as the first FAS element are performed simultaneously.

2. The method of claim 1, further comprising:

generating a second three-dimensional surface representation of a second component surface of the plurality of component surfaces which is different than the first component surface; and indexing, on the computer, the second three-dimensional surface representation as a second FAS element by assigning the second three-dimensional surface representation a unique second FAS ID, different than the unique first FAS ID, which associates the second FAS element with the component.

3. The method of claim 2, wherein the first FAS dataset includes at least one scalar attribute for the first component surface represented by the first FAS element.

4. The method of claim 1, further comprising:

generating a geometrical representation of a non-surface geometrical element of the three-dimensional CAD model; and indexing, on the computer, the geometrical representation as a second FAS element by assigning the geometrical representation a unique second FAS ID, different than the unique first FAS ID, which associates the second FAS element with the component.

5. The method of claim 4, wherein the non-surface geometrical element is one of a point, a line, an axis, a plane, or a volume of the three-dimensional CAD model.

6. A data processing system for carrying out the method of claim 1, the system comprising:

a processor; and the one or more memory devices in signal communication with the processor, the one or more memory devices containing instructions recorded therein which, when executed by the processor, cause the processor to:

receive the three-dimensional CAD model of the component, the three-dimensional CAD model including the plurality of component surfaces;

generate the first three-dimensional surface representation of the first component surface of the plurality of component surfaces; and index, on the computer, the first three-dimensional surface representation as the first function-attributed surface (FAS) element by assigning the first three-dimensional surface representation the unique first FAS ID which associates the first FAS element with the component.

7. The system of claim 6, wherein the one or more memory devices contains instructions recorded therein which, when executed by the processor, further cause the processor to:

generate a second three-dimensional surface representation of a second component surface of the plurality of component surfaces which is different than the first component surface; and index, on the computer, the second three-dimensional surface representation as a second FAS element by assigning the second three-dimensional surface representation a unique second FAS ID, different than the unique first FAS ID, which associates the second FAS element with the component.

8. The system of claim 6, wherein the FAS database is in signal communication with the processor, and wherein the one or more memory devices contains instructions recorded therein which, when executed by the processor, further cause the processor to:

store, on the one or more memory devices, the product manufacturing information (PMI) for the first FAS element as the first FAS dataset in the FAS database; and assign the unique first FAS ID to the first FAS dataset.

9. The system of claim 8, wherein the first FAS dataset includes at least one scalar attribute for the first component surface represented by the first FAS element.

10. The system of claim 8, wherein the touch screen is in signal communication with the processor, wherein the one or more memory devices contain instructions recorded therein which, when executed by the processor, further cause the processor to:

generate the graphical user interface displayed on the touch screen; and receive the at least a portion of the PMI from the user via the graphical user interface displayed on the touch screen.

11. The system of claim 6, wherein the one or more memory devices contains instructions recorded therein which, when executed by the processor, further cause the processor to:

generate a geometrical representation of a non-surface geometrical element of the three-dimensional CAD model; and index, on the computer, the geometrical representation as a second FAS element by assigning the geometrical representation a unique second FAS ID, different than the unique first FAS ID, which associates the second FAS element with the component.

12. The system of claim 6, further comprising a communication network in signal communication with the processor.

13. A computer implemented method for augmenting a three-dimensional model of a gas turbine engine component in a computer-aided design (CAD) environment, the method comprising:

receiving a three-dimensional CAD model of the component, the three-dimensional CAD model including a plurality of component surfaces;

generating a first surface representation of a first component surface of the plurality of component surfaces;

generating a second surface representation of a second component surface of the plurality of component surfaces which is different than the first component surface;

indexing, on a computer, the first surface representation as a first function-attributed surface (FAS) element by assigning the first surface representation a unique first FAS ID which associates the first FAS element with the component and indexing the second surface representation as a second FAS element by assigning the second surface representation a unique second FAS ID, different than the unique first FAS ID, which associates the second FAS element with the component;

storing, on one or more memory devices, a product manufacturing information (PMI) for the first FAS element as a first FAS dataset in a FAS database, wherein the PMI includes contextual information including one of stress peak area, airflow direction of the first component surface, stack-up information, life cycle information, repair information, or information gathered during component operation;

assigning the unique first FAS ID to the first FAS dataset;

generating a graphical user interface displayed on a touch screen;

receiving at least a portion of the PMI from a user via the graphical user interface displayed on the touch screen; and manufacturing the modeled gas turbine engine component, with a manufacturing equipment, based on the three-dimensional CAD model;

wherein the unique first FAS ID and the unique second FAS ID are based on a hierarchical tree referring to one or more features of the three-dimensional CAD model; and wherein the generating the first three-dimensional surface representation, the indexing the first surface representation as the first FAS element, and the indexing the second surface representation as the second FAS element are performed simultaneously.

14. The method of claim 13, wherein the PMI includes at least one scalar attribute for the first component surface represented by the first FAS element.

15. The method of claim 13, wherein the PMI is stored in the first FAS dataset as an object-oriented structure string.

* * * * *